United States Patent
Al Azim et al.

(10) Patent No.: US 10,734,052 B2
(45) Date of Patent: Aug. 4, 2020

(54) BUFFERED SPIN-TORQUE SENSING DEVICE FOR GLOBAL INTERCONNECT CIRCUITS

(71) Applicant: Purdue Research Foundation, West Lafayette, IN (US)

(72) Inventors: Zubair Al Azim, Stanford, CA (US); Ankit Sharma, Boise, ID (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/168,728

(22) Filed: Oct. 23, 2018

(65) Prior Publication Data
US 2019/0122716 A1    Apr. 25, 2019

Related U.S. Application Data

(60) Provisional application No. 62/576,573, filed on Oct. 24, 2017.

(51) Int. Cl.
| | | |
|---|---|---|
| *G11C 11/16* | (2006.01) | |
| *G11C 11/18* | (2006.01) | |
| *H01L 43/10* | (2006.01) | |
| *H01L 43/04* | (2006.01) | |
| *H01L 43/08* | (2006.01) | |
| *H01L 43/06* | (2006.01) | |

(52) U.S. Cl.
CPC ........ *G11C 11/161* (2013.01); *G11C 11/1673* (2013.01); *G11C 11/1675* (2013.01); *G11C 11/18* (2013.01); *H01L 43/04* (2013.01); *H01L 43/10* (2013.01); *H01L 43/06* (2013.01); *H01L 43/08* (2013.01)

(58) Field of Classification Search
None
See application file for complete search history.

(56) References Cited

U.S. PATENT DOCUMENTS

| | | |
|---|---|---|
| 7,532,504 B2 | 5/2009 | Saito |
| 8,580,408 B2 | 11/2013 | Kim et al. |
| 8,687,415 B2 | 4/2014 | Parkin et al. |
| 9,208,845 B2 | 12/2015 | Currivan Incorvia et al. |
| 9,230,626 B2 | 1/2016 | Buhrman et al. |
| 9,660,582 B2 * | 5/2017 | Wang .................. H03B 15/006 |
| 10,468,456 B2 * | 11/2019 | Jacob .................. G11C 11/1673 |

(Continued)

OTHER PUBLICATIONS

Liu et al., "Spin-Torque Switching with the Giant Spin Hall Effect of Tantalum," Science, vol. 365, pp. 555-558, 2012.

(Continued)

*Primary Examiner* — Douglas King
(74) *Attorney, Agent, or Firm* — Piroozi-IP, LLC

(57) ABSTRACT

A bit cell driving mechanism is disclosed. The mechanism includes a bit cell which includes a first magnetic tunnel junction (MTJ) cell, including a pinned layer, a non-magnetic layer, a free layer having two magnetic regions separated by a laterally moveable domain wall, and a spin-hall metal layer configured to receive an electrical current therethrough which causes the DW to move laterally. The mechanism also includes a second MTJ cell coupled to the first MTJ cell as well as an interconnect driver configured to provide electrical current to the first MTJ cell during a write operation.

26 Claims, 12 Drawing Sheets

(56) References Cited

U.S. PATENT DOCUMENTS

| 2014/0169088 | A1* | 6/2014 | Buhrman | G11C 16/30 |
| | | | | 365/158 |
| 2015/0061056 | A1 | 3/2015 | Jan et al. | |
| 2015/0325278 | A1 | 11/2015 | Bauer et al. | |
| 2015/0333839 | A1 | 11/2015 | Li et al. | |
| 2016/0247550 | A1* | 8/2016 | Fukami | H01L 43/08 |
| 2017/0178705 | A1 | 6/2017 | Buhrman et al. | |

OTHER PUBLICATIONS

Emori et al., "Current-driven dynamics of chiral ferromagnetic domain walls," Nature Materials, vol. 12, pp. 611-616, 2013.

Emori et al., "Spin Hall torque magnetometry of Dzyaloshinskii domain walls," Phys. Rev. B, vol. 90, p. 184427, 2014.

Martinez et al., "Current driven dynamics of Dzyaloshinskii domain walls in the presence of in-plane fields: Full micromagnetic and one-dimensional analysis," Journal of Applied Physics, vol. 115, p. 213909, 2014.

Fukami et al., "Low-current perpendicular domain wall motion cell for scalable high-speed MRAM," in IEEE Symposium on VLSI Technology, 2009.

Liu et al., "Spin-torque ferromagnetic resonance induced by the spin Hall effect," Physical Review Letters, vol. 106, No. 3, p. 036601, 2011.

* cited by examiner

BUFFERED SPIN-TORQUE SENSING DEVICE FOR GLOBAL INTERCONNECT CIRCUITS

CROSS-REFERENCE TO RELATED APPLICATIONS

The present patent application is related to and claims the priority benefit of U.S. Provisional Patent Application Ser. No. 62/576,573 filed Oct. 24, 2017, the contents of which are hereby incorporated by reference into the present disclosure.

STATEMENT REGARDING GOVERNMENT FUNDING

This invention was made with no government support.

TECHNICAL FIELD

The present disclosure generally relates to electronic circuits, and in particular, to drive mechanisms for long interconnects.

BACKGROUND

This section introduces aspects that may help facilitate a better understanding of the disclosure. Accordingly, these statements are to be read in this light and are not to be understood as admissions about what is or is not prior art.

Lengths of on-chip and off-chip interconnects lead to large capacitance that result in excessive energy consumption. Various approaches have been implemented such as low-swing voltage mode (shown in FIG. 11) and low-swing current mode (shown in FIG. 12). In low-swing voltage mode, a smaller voltage, e.g., 1.2 V (shown as $V_{low}$ in FIG. 11), is used and it is stepped up to nominal voltages, e.g., 5 V (shown as $V_{DD}$ in FIG. 11), utilizing a voltage boost circuit known to a person having ordinary skill in the art. In low-swing current mode, the low voltage (shown as $V_{low}$ in FIG. 12) is passed through a load resistor (shown as $R_L$ in FIG. 12) and the resultant current is converted to a nominal voltage (shown as $V_{DD}$ in FIG. 12) using trans-impedance amplification. However, these approaches still suffer from excessive capacitance and thus energy consumption limiting the length of interconnects, whether on-chip or off-chip. Other approaches may cause too much delay, thereby causing violation of clock edges.

Therefore, there is an unmet need for a novel approach for energizing on-chip and off-chip interconnects that reduces energy consumption when the interconnects are charges and discharged and which does not add clock edge-violating delays.

SUMMARY

A bit cell driving mechanism is disclosed. The mechanism includes a bit cell. The bit cell includes a first magnetic tunnel junction (MTJ) cell which includes a first magnetic layer with a fixed a polarity (pinned layer (magnetic PL)) in a first magnetic direction. The first MTJ further includes a non-magnetic layer (NML) vertically positioned adjacent to the magnetic PL. The first MTJ cell also include a second magnetic layer vertically positioned adjacent the NML with selective polarity (free layer (magnetic FL)). The magnetic FL includes two magnetic regions separated by a laterally moveable domain wall (DW), each of the two magnetic regions includes a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold. The first MTJ cell also includes a spin-hall metal (SHM) layer vertically positioned adjacent the magnetic FL and is configured to receive an electrical current therethrough, wherein when the electrical current is in a first current direction it results the DW to move laterally along the first current direction and wherein when the electrical current is opposite the first current direction it results in the DW to move laterally opposite the first current direction. The mechanism also includes a second MTJ cell (read MTJ) coupled to the first MTJ cell. The read MTJ cell includes a magnetic PL with a fixed magnetic polarity, an NML positioned vertically adjacent the magnetic PL, and a magnetic FL positioned vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold. The mechanism also includes an interconnect driver configured to provide electrical current to the SHM layer during a write operation.

A method for driving a bit cell is also disclosed. The method includes passing a current through a bit cell. The bit cell includes a first magnetic tunnel junction (MTJ) cell which includes a first magnetic layer with a fixed a polarity (pinned layer (magnetic PL)) in a first magnetic direction. The first MTJ further includes a non-magnetic layer (NML) vertically positioned adjacent to the magnetic PL. The first MTJ cell also include a second magnetic layer vertically positioned adjacent the NML with selective polarity (free layer (magnetic FL)). The magnetic FL includes two magnetic regions separated by a laterally moveable domain wall (DW), each of the two magnetic regions includes a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold. The first MTJ cell also includes a spin-hall metal (SHM) layer vertically positioned adjacent the magnetic FL and is configured to receive an electrical current therethrough, wherein when the electrical current is in a first current direction it results the DW to move laterally along the first current direction and wherein when the electrical current is opposite the first current direction it results in the DW to move laterally opposite the first current direction. The method also includes coupling the bit cell to a second MTJ cell (read MTJ). The read MTJ cell includes a magnetic PL with a fixed magnetic polarity, an NML positioned vertically adjacent the magnetic PL, and a magnetic FL positioned vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold. The method also includes coupling an interconnect driver to the bit cell, to provide the electrical current to the SHM layer during a write operation.

DETAILED DESCRIPTION

Figure 1:
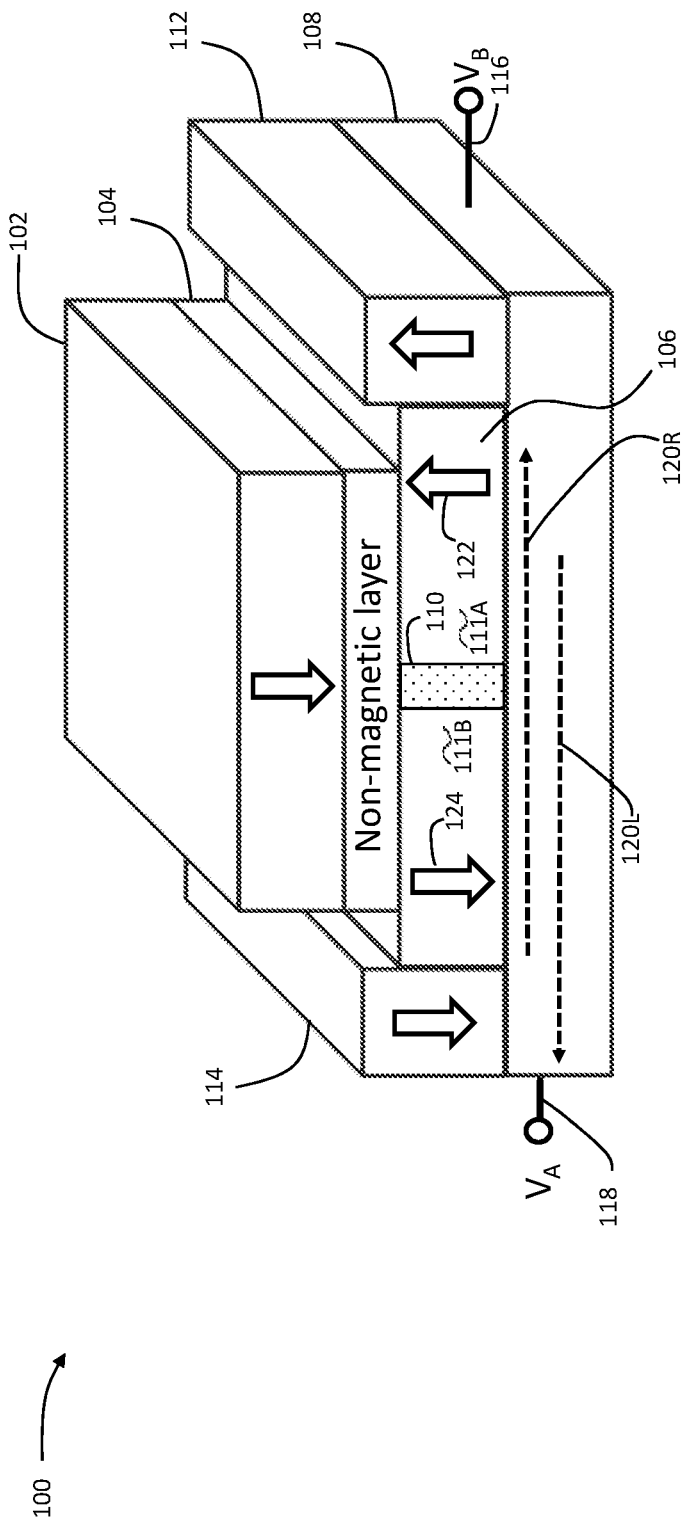
FIG. 1 is a perspective view of a bit cell according to the present disclosure, in which the bit cell can be in a parallel or anti-parallel configuration based on lateral position of a domain wall in accordance to current passing through a spin-hall metal (SHM) layer.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach for energizing on-chip and off-chip interconnects is presented that reduces energy consumption when the interconnects are charged and discharged and which does not add clock edge-violating delays. With reference to FIG. 1, a specialized magnetic tunnel junction (MTJ) 100 is shown which is to be used as a bit cell to be driven by an interconnect as associated circuitry (not shown, but discussed in more detail below). The MTJ 100 includes a magnetic pinned layer (PL) 102 disposed adjacent to a non-magnetic layer 104, the sum of the two structures is disposed adjacent to a magnetic free layer (FL) 106. The sum of all the three structures is disposed adjacent a spin-hall metal (SHM) layer 108. The magnetic (FL) 106 further includes a domain wall (DW) 110 separating two regions of the magnetic FL 106. These regions are identified as 11A and 11B. The MTJ 100 further includes optional pinned layers 112 and 114 disposed laterally adjacent to the magnetic free layer 106. The SHM layer 108 is coupled to two terminals 116 and 118. By passing current via the terminals 116 and 118 through the SHM layer 108, current 120R and 120L can be established. The current 120R moves from the left side of the SHM layer 108 to the right side, while the current 120L moves from the right side of the SHM layer 108 to the left side. The direction of magnetization of the region 111A of the magnetic FL 106 is shown as 122 and is opposite the direction of magnetization of the region 111B of the magnetic FL 106 which is shown as 124.

The magnetic FL 106 of the MTJ 100 in the configuration shown in FIG. 1 has not been magnetized. Once magnetized by passing current via terminals 116 and 118 through the SHM layer 108, the DW 110 either moves i) from the position shown in FIG. 1 to the right if the current direction established by presenting a higher voltage at the terminal 118 vs. the terminal 116 and thus according the direction 120R or ii) to the left if the current direction established by presenting a higher voltage at the terminal 116 vs. the terminal 118 and thus according the direction 120L. In the former case, the MTJ 100 establishes a parallel configuration, which would present a lower vertical resistance through the MTJ 100, which can be arbitrarily identified as a "1". In the latter case, the MTJ 100 establishes an anti-parallel configuration, which would present a higher vertical resistance through the MTJ 100, which can be arbitrarily and respectively identified as a "0".

Figure 2:
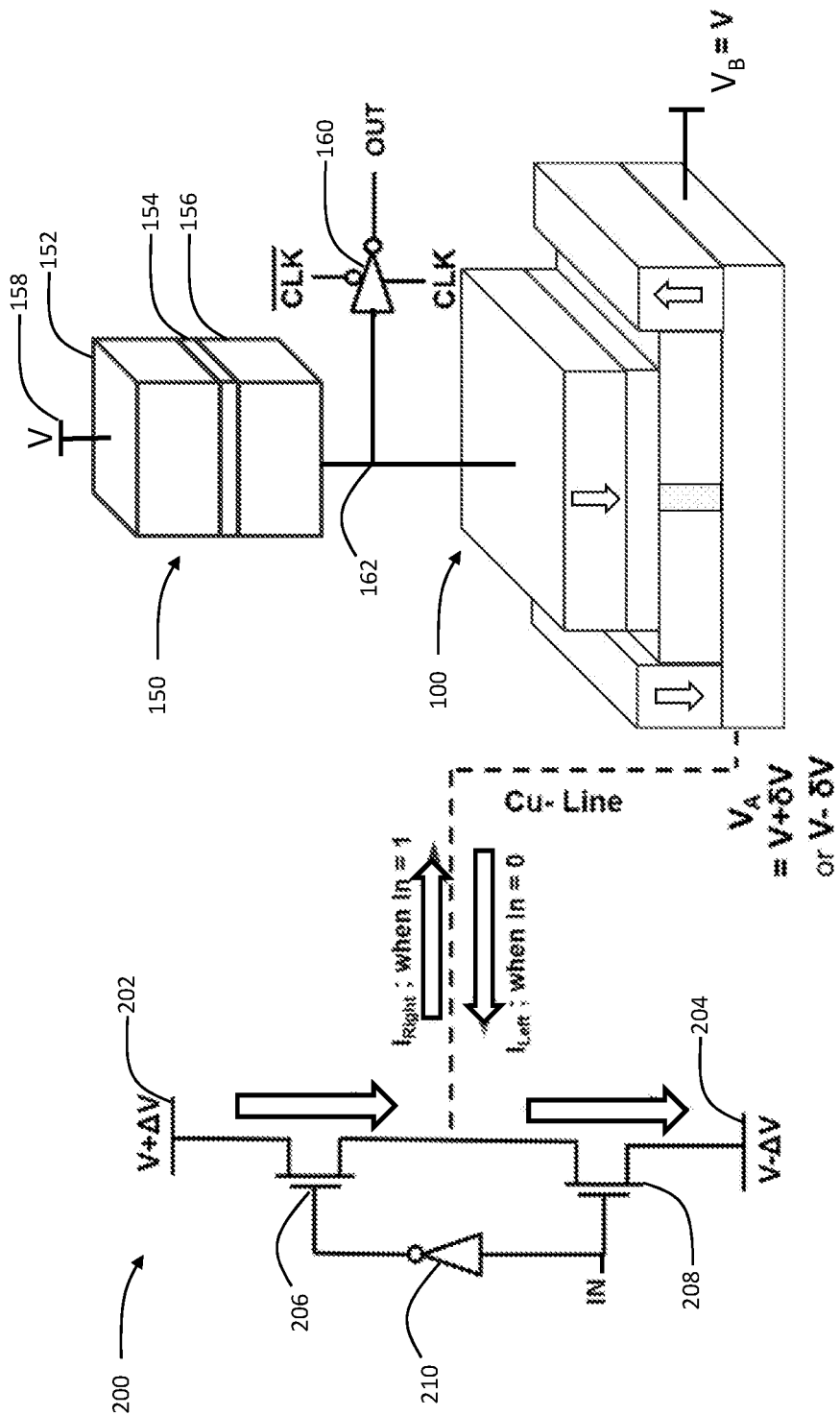
FIG. 2 is a schematic of the bit cell of FIG. 1 provided with a driving mechanism and a read mechanism.

Utilizing a second MTJ (also referred to herein as the read MTJ cell) as a voltage divider, a read circuitry according to the present disclosure can be utilized to read the value of the bit cell represented by the MTJ 100. Referring to FIG. 2, a circuit is shown using an interconnect driver 200 that can be used to program the MTJ 100 to a "1" or a "0" and then a read MTJ 150 used to read the value of the MTJ 100. The bit cell MTJ 100 (in the present disclosure MTJ 100 and bit cell MTJ 100 or simply bit cell MTJ are used interchangeable and are intended to refer to the MTJ 100) is coupled to the interconnect 200 and the read MTJ 150 such that the terminal 118 (see FIG. 1) is coupled to the output of the interconnect driver 200 (i.e., the mid-point between two switches 206 and 208) and the terminal 116 (see FIG. 1) is coupled to a voltage source (shown as $V_B$). The driver 200 includes a first voltage source 202 that represents V+ΔV and a second voltage source 204 that represents V−ΔV. Disposed between the first voltage source 202 and the second voltage source 204 is an inverter formed by switches 206 and 208 (e.g., p-channel–N-channel pair) receiving input from "IN". When IN is "0", the switch 206 is turned off and the switch 208 is turned on. The switches are coupled to each other via an inverter 210. Since the terminal 116 (see FIG. 1) is coupled to a higher voltage than the voltage source 204, a leftward current 120L (see FIG. 1) moves the DW 100 (see FIG. 1) to the left. In the embodiment of the MTJ 100 shown in FIG. 1, this leftward movement of the DW 100 (see FIGS. 1 and 5A discussed below) results in the MTJ 100 becoming anti-parallel, since the magnetic PL 102 (see FIGS. 1 and 5A) has a primarily opposite magnetization than the magnetic FL 106 (see FIG. 1). The anti-parallel configuration is arbitrarily assigned a value of "0", as discussed above.

Similarly, when IN is "1", the switch 206 is turned on and the switch 208 is turned off. Since the terminal 116 (see FIG. 1) is coupled to a lower voltage than the voltage source 202, a rightward current 120R (see FIG. 1) moves the DW 100 (see FIG. 1) to the right (see FIGS. 1 and 5B discussed below). In the embodiment of the MTJ 100 shown in FIG. 1, this rightward movement of the DW 100 (see FIG. 1) results in the MTJ 100 becoming parallel, since the magnetic PL 102 (see FIG. 1) has a primarily aligned magnetization as compared to the magnetic FL 106 (see FIGS. 1 and 5B). The parallel configuration is arbitrarily and accordingly assigned a value of "1", as discussed above.

Referring back to FIG. 2, the circuit shown also includes the read MTJ 150. The read MTJ 150 is provided to establish a voltage divider that can be used to identify whether the bit cell MTJ 100 is holding a "1" or a "0". The read MTJ 150 is based on an MTJ that is known to a person having ordinary skill in the art and it includes a sandwich of a PL magnetic 152, a non-magnetic layer 154, and a magnetic FL 156. If the directions of magnetization in the magnetic PL 152 and the magnetic FL 156 are the same, the read MTJ 150 is deemed to be in the parallel configuration providing a first resistance $R_1$. If, however, the directions of magnetization in the magnetic PL 152 and the magnetic FL 156 are the same, the read MTJ 150 is deemed to be in the anti-parallel configuration providing a second resistance $R_2$, where $R_1$ is less than $R_2$. The read MTJ 150 is also coupled to a source 158. The source 158 is shown as ground in FIG. 5A and FIG. 5B. It should be appreciated that the source is relative to the voltage at the terminal 116 (see FIG. 1). In a read-cycle, current flows through the terminal 116 (see FIG. 1), the bit cell MTJ 100, the read MTJ 150, and through the source 158. The read MTJ 150 can be set in advance to a parallel and/or anti-parallel configuration with its configuration known, apriori. Suppose, source 158 is ground and the terminal 116 (see FIG. 1) is at a voltage $V_B$ which is higher than ground. If both the bit cell MTJ 100 and the read MTJ 150 are in the parallel configuration, the voltage at a node 162 between the two cells is about $V_B/2$. If, however, the bit cell MTJ 100 is in the anti-parallel configuration and the read MTJ 150 remains in the parallel configuration, the voltage at a node 162 is about 0. By sensing the voltage at the node 162, e.g., using a clocked inverter 160, the content of the bit cell MTJ 100 can be ascertained (as "OUT", as shown in FIG. 2).

Figure 3:
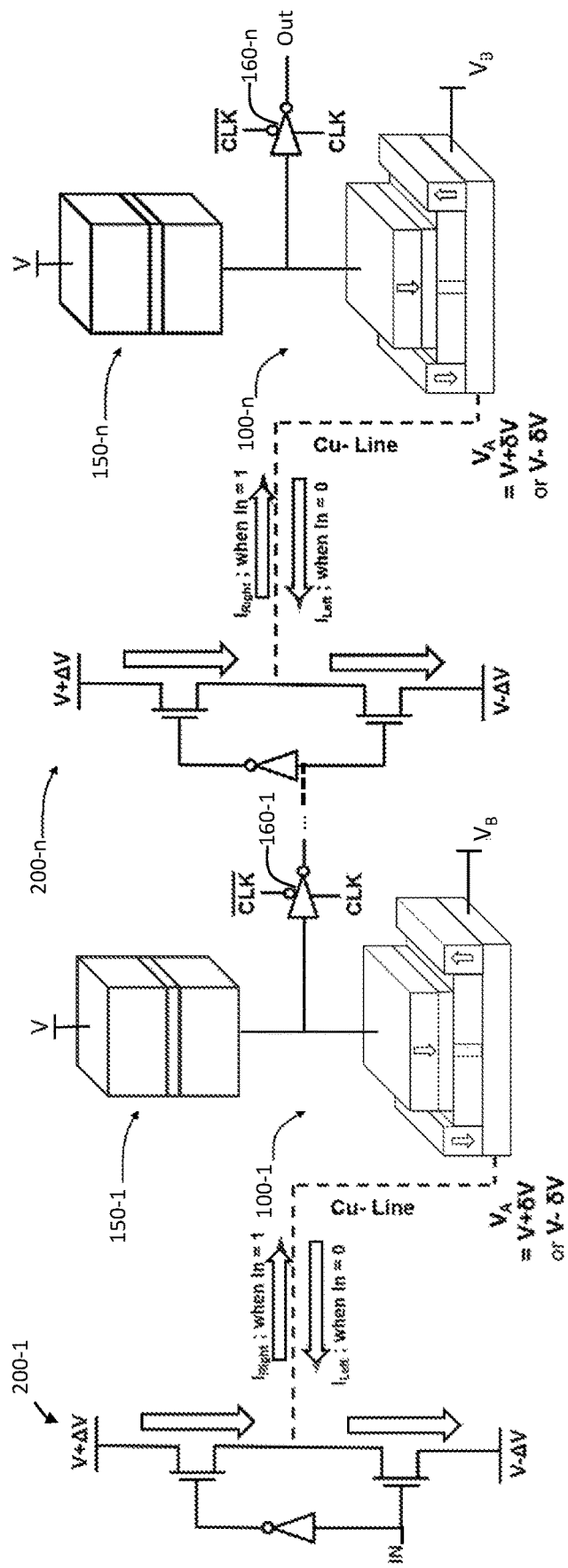
FIG. 3 is a schematic of the driving mechanism shown in FIG. 2 repeated in series to form a chain of buffer stages.

With one interconnect driver 200 and one bit cell MTJ 100 shown in FIG. 1, the same topology can be used with multiple drivers (i.e., buffers). Referring to FIG. 3, the same topology of FIG. 2 is shown with multiple buffers. Here the left most interconnect driver is identified as 200-1 along with its corresponding bit cell MTJ 100-1 and read MTJ 150-1. These components are connected in series to a number of other driver-bit cell MTJ-read MTJ as shown by the " . . . " and the last set identified as the right most interconnect driver is identified as 200-n along with its corresponding bit cell MTJ 100-n and read MTJ 150-n, and clocked inverter 160-n. In doing so, the output of one stage (i.e., the output of the clocked inverter 160-1 feeds the input of the next stage, i.e., the input IN, see FIG. 2, of the next stage).

Figure 4:
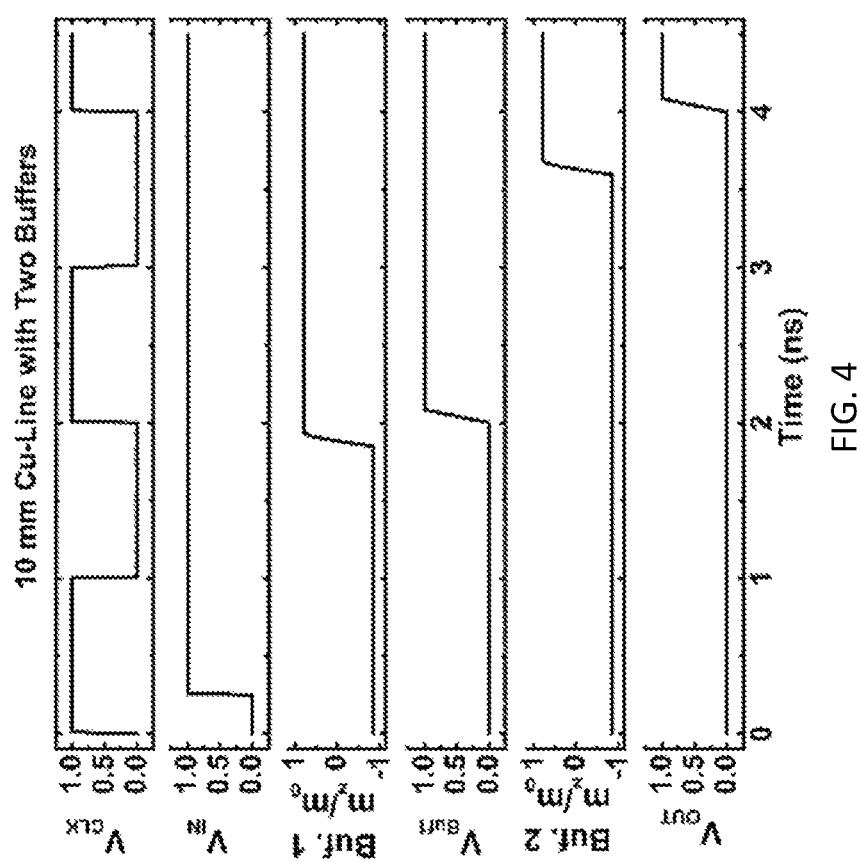
FIG. 4 is a timing graph showing rising edges of various signals shown in FIG. 3.

To more clearly show the operation of a chain of drivers (buffers), an exemplary timing chart is presented in FIG. 4. The timing chart in FIG. 4 includes a clock which has a period of 2 ns (i.e., 500 MHz). $V_{IN}$ (the voltage at input terminal IN, see FIGS. 2 and 3) changes at some time after a rising edge of the clock. The magnetization of the bit cell 100-1 (see FIG. 3) changes (i.e., changing the value of the bit cell MTJ 100-1 from holding a value of 0 to a value of 1) at some point prior to the next rising edge of the clock. The delay is due to line capacitance and intrinsic delays of the MTJ cell. This delay is shown as the time between the rising edge of $V_{IN}$ and the rising edge of the $m_z/m_0$ (some time before 2 ns). Consequently, the output of the first stage (shown as $V_{Buf1}$) rises from 0 to 1 at the next rising edge of the clock. In a two-buffer circuit, $V_{Buf1}$ is the input to the second buffer. $V_{BUF1}$ (the voltage at output of the clocked inverter 160-1, see FIG. 3) changes at the rising edge of the clock. The magnetization of the bit cell 100-2 (not shown) changes (i.e., changing the value of the bit cell MTJ 100-2 (not shown) from holding a value of 0 to a value of 1) at some point prior to the next rising edge of the clock. The delay is due to line capacitance and intrinsic delays of the MTJ cell. This delay is shown as the time between the rising edge of $V_{Buf1}$ and the rising edge of the $m_z/m_0$ (some time before 4 ns). Consequently, the output of the first stage (shown as $V_{out}$) rises from 0 to 1 at the next rising edge of the clock at about 4 ns.

Figure 5:
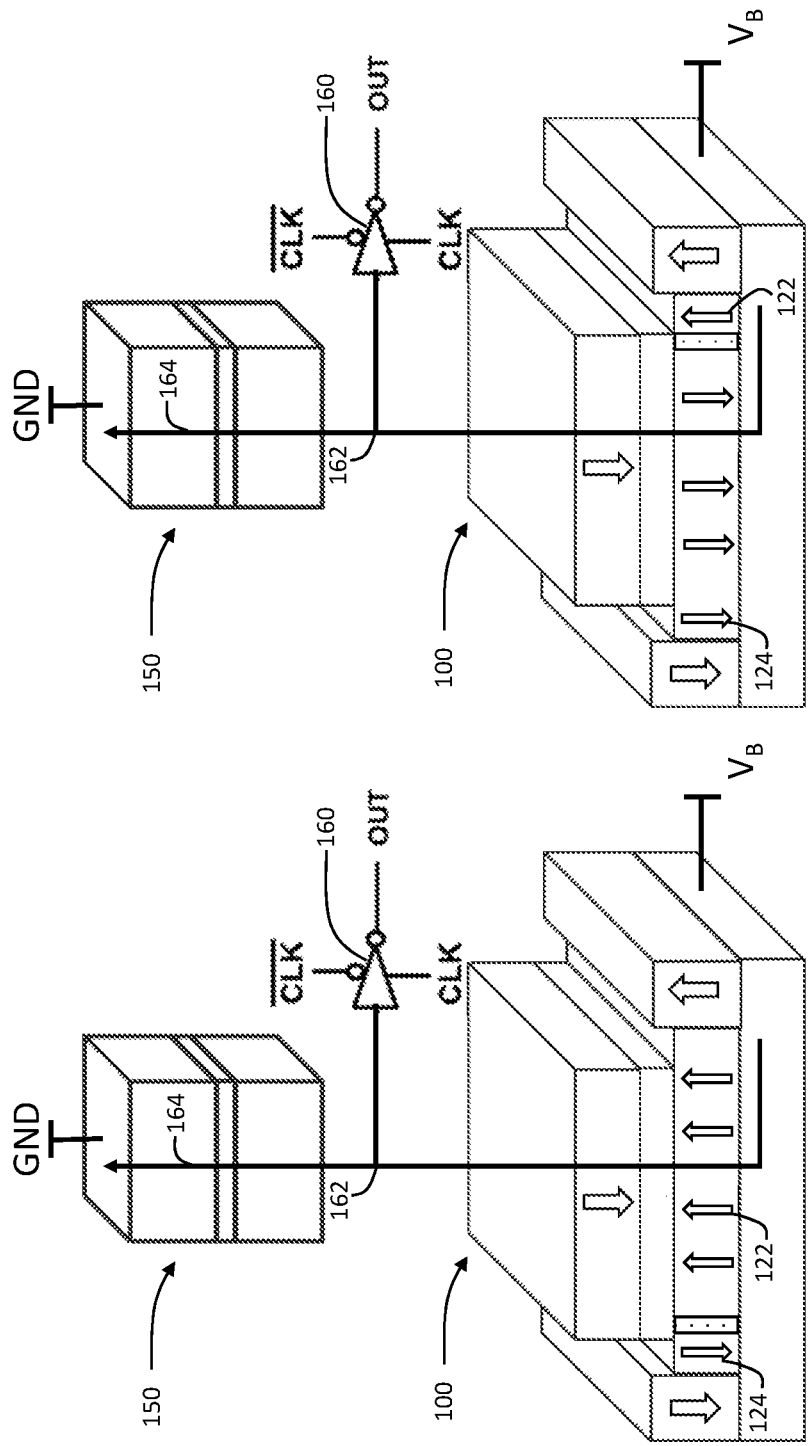
FIGS. 5A and 5B represent a portion of the driving mechanism of FIG. 2 shown in a read operation, where the bit cell is shown in the anti-parallel configuration in FIG. 5A and in the parallel configuration in FIG. 5B.

As discussed above, FIGS. 5A and 5B show schematic views of the bit cell MTJ 100 in a read operation along with the read MTJ 150. As discussed previously, when the terminal 116 (see FIG. 1) is coupled to a voltage source higher than the voltage source 158 (see FIG. 2), a current 164 flows through the bit cell MTJ 100 and the read MTJ 150. It should be appreciated that the voltage source 158 (see FIG. 2) can be set to be at a higher voltage than the terminal 116 (see FIG. 1), in which case the current 164 would have the opposite direction. Using a known magnetization configuration for the read MTJ 150 (i.e., parallel or anti-parallel), the voltage at node 162 can be used to determine the value held in the bit cell 100. In FIG. 5A, the bit cell MTJ 100 is shown in the anti-parallel configuration, since the direction of magnetization of the region 111A of the magnetic FL 106, shown as 122 (see FIG. 1) is the dominant direction in the magnetic FL 106 and is opposite the direction of the magnetization of the magnetic PL 102. This is due to the DW 110 having been moved to the left owing to a leftward current 120L having moved the DW 110 in a write operation at some time in the past. In FIG. 5B, the bit cell MTJ 100 is shown in the parallel configuration, since the direction of magnetization of the region 111B of the magnetic FL 106, shown as 124 (see FIG. 1) is the dominant direction in the magnetic FL 106 and is aligned with the direction of the magnetization of the magnetic PL 102. This is due to the DW 110 having been moved to the right owing to a rightward current 120R having moved the DW 110 in a write operation at some time in the past.

Figure 6:
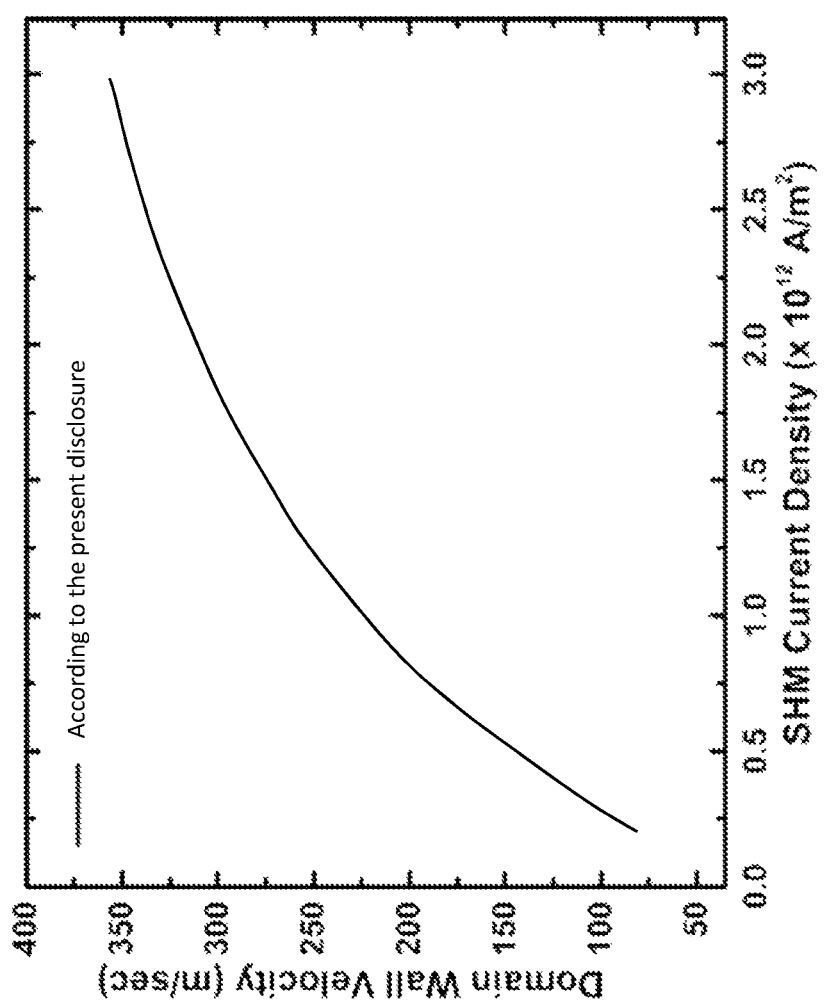
FIG. 6 is a graph of domain wall velocity measured in m/sec vs. SHM current density measured in $\times 10^{12}$ A/m$^2$, based on the bit cell shown in FIG. 1.

When a charge current flows through the SHM layer 108, it induces an effective magnetic field ($\vec{H}_{SHE}$) on the DW 110. The movement of DW follows the current flow direction in the SHM layer 108. Hence, as discussed above, the DW 110 can be moved in either direction by altering the direction of current flow. The magnetic FL layer 106, according to one embodiment, is made from cobalt-iron (CoFe). The CoFe magnetic FL 106 has a that can be obtained from the Non-equilibrium Green's Function (NEGF) based spin transport simulations, known to a person having ordinary skill in the art. The resistance of the MTJ is thus used in an MTJ-SPICE model with 45 nm CMOS technology to evaluate the interconnect circuit operations. The charge current ($I_e$) flowing through the SHM is obtained from the SPICE simulations and the corresponding spin current ($I_s$) is calculated as:

$$I_s = \theta_{sh} \frac{A_{MTJ}}{A_{SHM}} I_e, \quad (1)$$

where, $\theta_{sh}$ is the spin-Hall angle, $A_{MTJ}$ and $A_{SHM}$ are the cross-sectional areas of the MTJ and the SHM, respectively. The spin current from Eqn. (1) is used with generalized Landau-Lifshitz-Gilbert (LLG) equation to analyze the magnetization dynamics. DW velocity against changing SHM layer current density is first reviewed based on the parameters provided in Table 1. DW velocity increases with increasing current density through the SHM layer. This relationship is shown in FIG. 6 in which a graph of domain wall velocity (m/sec) is shown against SHM current density ($\times 10^{12}$ A/m$^2$). As can be seen the DW velocity is sufficiently high between (between 200-300 msec) with at least 1-2× $10^{12}$ A/m$^2$ SHM current density.

TABLE 1

Design parameters for bit cell MTJ

| Parameter | Value Used |
|---|---|
| Sat. Magnetization ($M_s$) | 700 kA/m |
| Anisotropy Const. ($K_u$) | 4.8 × 10$^5$ J/m$^3$ |
| Exchange Const. ($A_{ex}$) | 1 × 10$^{-11}$ J/m |
| DMI Const. (D) | −1.2 mJ/m$^2$ |
| Spin Hall angle | 0.07 |
| Gilbert Damping Const. | 0.3 |
| MgO thickness | 1 nm |

With the device dimensions shown in Table 2 for the bit cell MTJ, the maximum voltage required across the SHM layer is 20 mV to ensure the SHM current density in the range of (1-2)×10$^{12}$ A/m$^2$ which ensures DW movement. The ΔV at the transmitter side must ensure this voltage difference across the SHM layer and the rest of the voltage can drop across the interconnect lines. Since this method is primarily intended for long on-chip or off-chip global lines, wider metal wires (with lower resistance and higher capacitance due to being wider than lower metal levels) can be used for the signal transmission. According to one exemplary embodiment, the metal wire has a unit resistance, $r_w$=50Ω/mm. Therefore, for Cu-lines up to 20 mm length, the maximum required ΔV at the transmitting side is about 200 mV which will ensure sufficient voltage drop across the SHM layer. As discussed above, by altering the polarity of voltage difference across the SHM layer, the current direction is also altered. When the current flows in the right direction through the SHM layer (120R, see FIG. 1); the DW 110 (see FIG. 1) in the adjacent magnetic FL 106 moves to the right and vice-versa. The position of the DW is read using the reference MTJ as discussed above. Standard binary level can be detected with a clocked CMOS buffer, as discussed above.

TABLE 2

Device operation conditions

| Parameter | Value Used |
|---|---|
| Cu-Wire resistance | 50 Ω/mm |
| Cu-Wire capacitance | 0.25 fF/μm |
| SHM current density | 1-2 × 10$^{12}$ A/m$^2$ |
| SHM dimensions | 50 × 20 × 3 nm$^3$ |
| Free layer dimensions | 50 × 20 × 0.6 nm$^3$ |
| SHM layer resistance | 166.67 Ω |
| Free layer resistance | 7.08 kΩ |
| MTJ parallel resistance | 0.8454 kΩ |
| MTJ anti-parallel resistance | 1.99 kΩ |
| Max. V across SHM layer | 20 mV |
| Clock Period | 2 ns |

From the data in Table 2, spin-Hall metal layer has dimensions of about 50×20×3 nm$^3$, and Spin-Hall metal layer resistance is about 166.67Ω. With a satisfactory current density of about 1-2×10$^{12}$ A/mm$^2$, and SHM layer dimensions, the required current flow through the SHM layer is about 2×10$^{12}$ A/mm$^2$×SHM area=2×10$^{12}$×20×3× $(10^{-9})^2$ A=1.2×10$^{-4}$ A. Required voltage across the SHM layer is about =1.2×10$^{-4}$ A×SHM Resistance=20 mV. Assuming an exemplary wire length up to 20 mm, the total wire resistance=wire resistance per mm×20=50×20=1000Ω. Therefore, the voltage required at the transmitter side (ΔV in FIG. 2) to ensure 20 mV voltage difference at the receiving end=20 mV×[(1000+166.67)/166.67] which is about 140 mV. Keeping a factor of error, the ΔV in FIG. 2 should be about 200 mV.

Although, the voltage across the interconnect line is very low in this method, the delay can be relatively high for very long Cu-lines. The interconnect delay in Cu-lines generally increases as line length squared. In the conventional technique; this delay is minimized by introducing repeaters in the line and thereby breaking up the line in shorter segment, as discussed above. The delays are shown in FIG. 4, discussed above, where a Cu-line is 10 mm long and it is pipelined in two segments by using one buffer stage in between the transmitter and the receiver, as discussed above.

Figure 7:
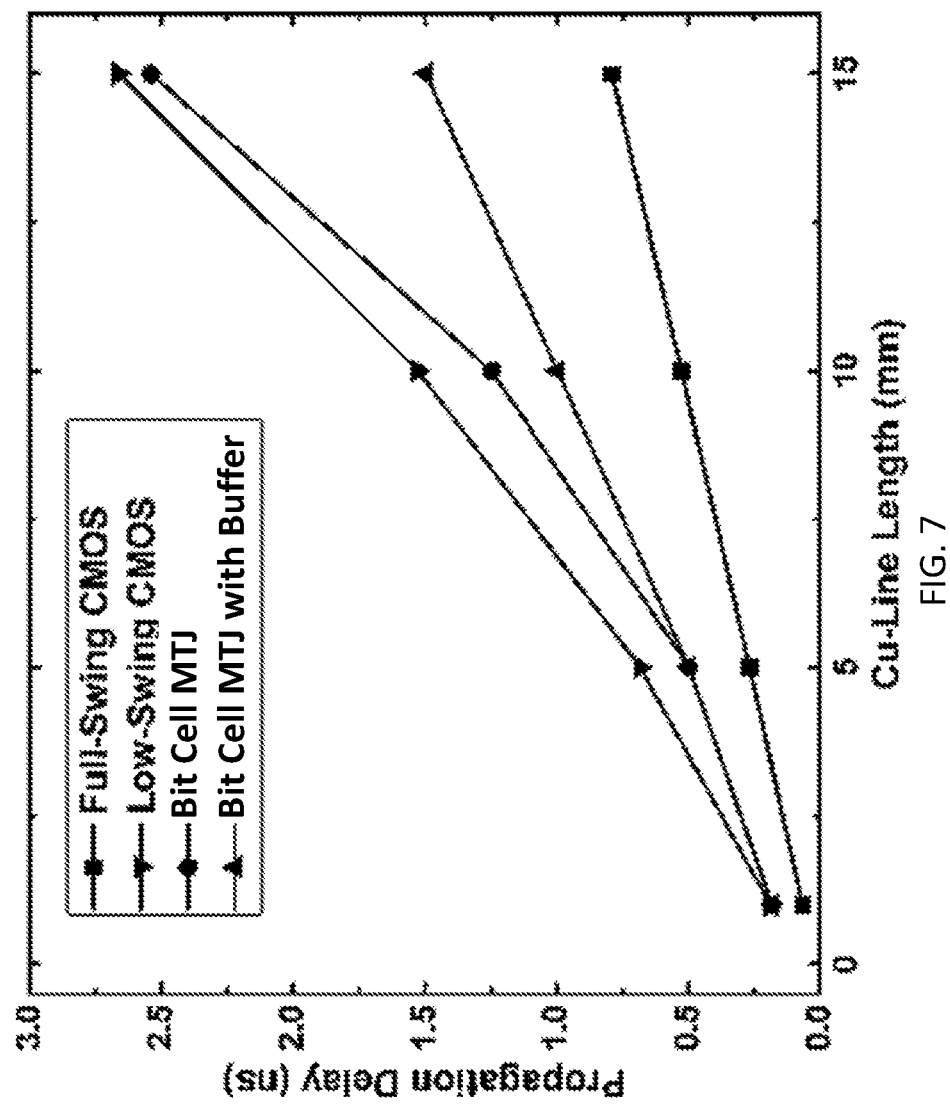
FIG. 7 is a graph of propagation delay resulting from the circuit of FIGS. 2 and 3 as compared to prior art buffering approaches.
Figure 11:
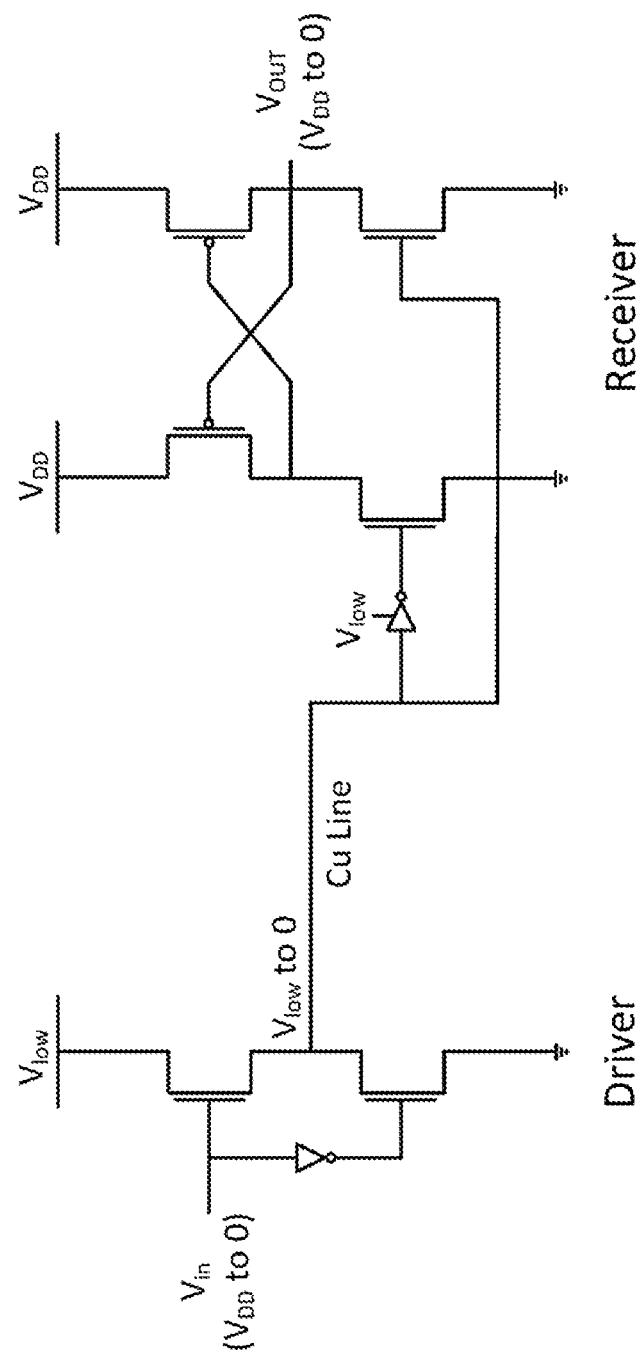
FIG. 11 is a circuit of full swing CMOS (no voltage shifting) used according to the prior art buffering.
Figure 12:
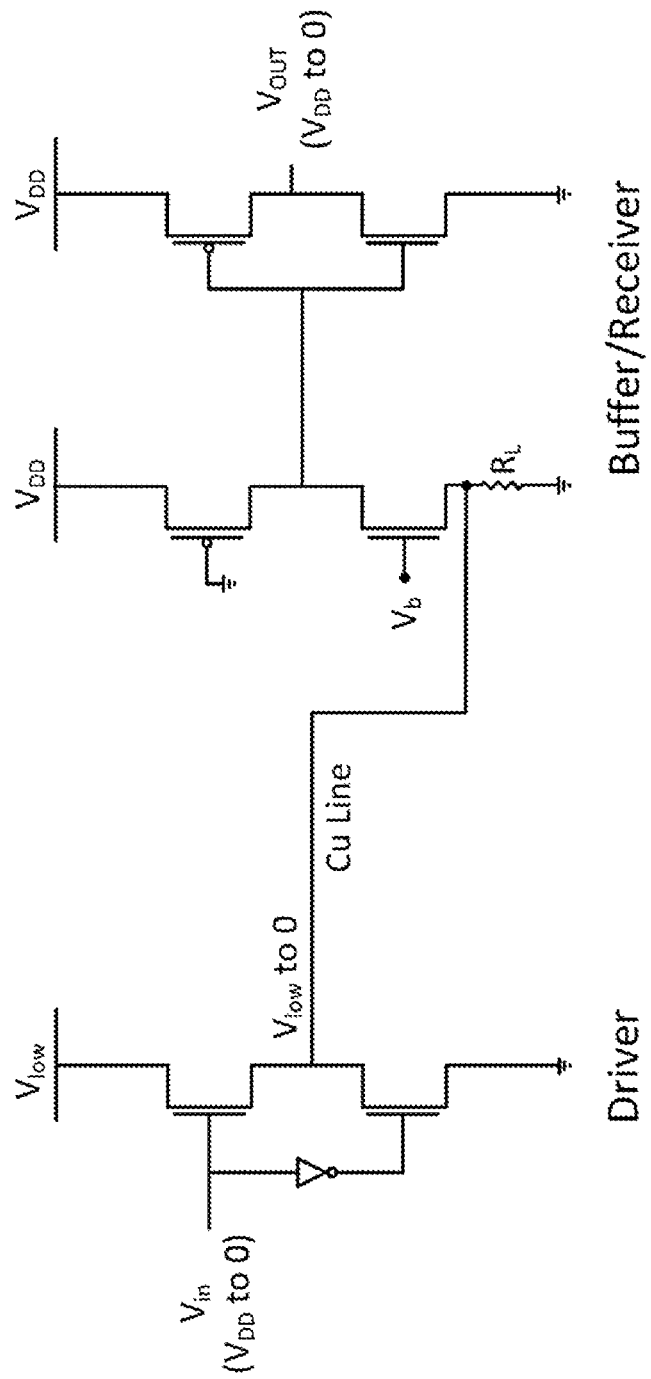
FIG. 12 is a circuit of low swing current used according to the prior art buffering.

The architecture disclosed herein is a low voltage, low current interconnection with a fast and energy efficient signal conversion process at the receiver. Moreover, the delay is minimized in comparison to previously proposed architectures due use of MTJs and to the introduction of buffering in longer lines. A comparison of delay based on the interconnects according to the present disclosure and with those of conventional CMOS interconnects is shown in FIG. 7, in which a graph of propagation delay in ns is shown vs. Cu line length in mm. In FIG. 7, full swing CMOS (no voltage shifting) is shown to have the lowest propagation delays, while low-swing CMOS (see FIG. 11), has slightly higher propagation delays. The CMOS implementation shown is for 45 nm technology with both full-swing and low-swing (using conventional level conversions) designs with buffers. The architecture according to the present disclosure shows propagation delays higher than the low-swing CMOS and the embodiment with buffers have even higher propagation delays, because of multiple buffering stages. In comparison to full-swing CMOS design, the delay in bit cell MTJ approach, according to the present disclosure, is higher due to the delay in the receiver for DW movement and subsequent resistive divider action and the capacitance associated therewith. However, the energy consumption in full-swing CMOS is significantly higher compared to the ST-sensor design as discussed further below.

Figure 8:
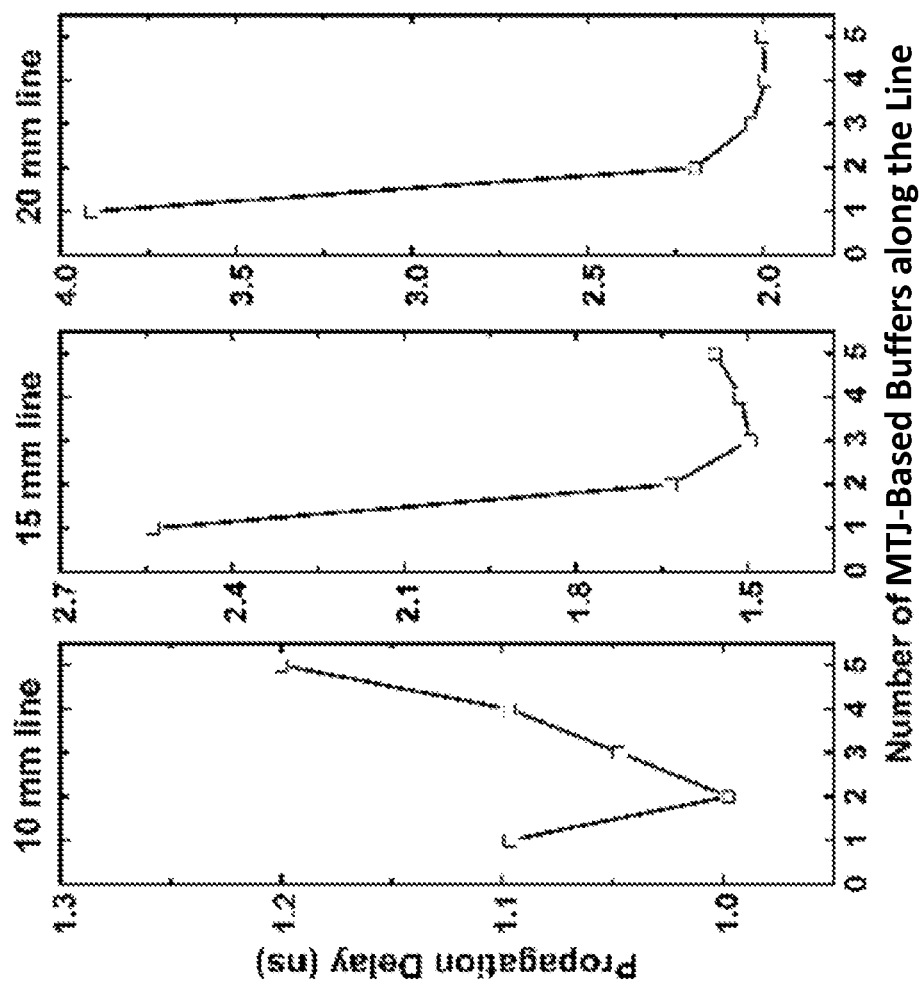
FIG. 8 provides graphs of propagation delay measured in ns for various lengths of copper line based on a number of buffer stages as provided in FIG. 3.

Low-swing CMOS can be used to reduce the energy consumption. However, the conversion from low-to-high voltage is relatively slower and this delay leads to higher delay for low-swing schemes. The bit cell MTJ based approach according to the present disclosure without any buffering shows almost similar delay as low-swing CMOS (see FIG. 7). This delay can be reduced by using optimum number of buffers along the line. The total delay ($T_p$) can be approximated by the following equation:

$$T_p \approx 0.38 \times r_w c_w (L/M)^2 + (M-1) \times t_{buf} \qquad (2)$$

Where L is the total wire length,
M is the number of buffer stages,
$t_{buf}$ is the ST-buffer delay, and
$r_w$, $c_w$ are the unit wire resistance and capacitance, respectively. As shown in FIG. 8, which is a graph of propagation delay in ns vs. number of MTJ-based buffers for different Cu line lengths (i.e., 10 mm, 15 mm, and 20 mm), the introduction of only a few buffers can reduce the delay in MTJ-based approach of the present disclosure. However, additional buffers can lead to increase in delay as expected from Eqn. (2).

Figure 9:
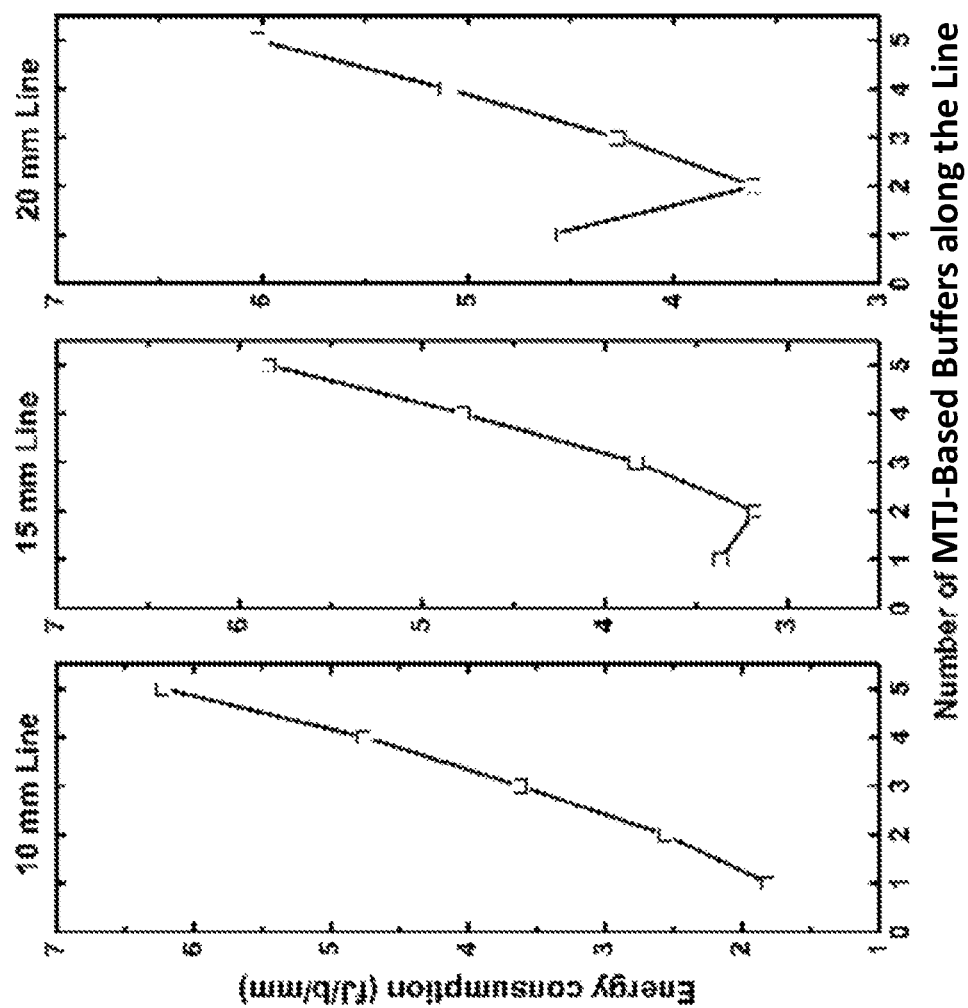
FIG. 9 provides graphs of energy consumption measured in fJ/b/mm for various lengths of copper line based on a number of buffer stages as provided in FIG. 3.

However, as discussed above, the energy consumption I slower as compare with CMOS interconnects. Due to the very low voltage operation in MTJ-based interconnects, there is a significant reduction in the energy consumption. The total energy consumption includes the ohmic loss (static energy dissipation in the Cu-line and the SHM layer resistances, $E_{static}$), the capacitive loss (dynamic line loss in the wire capacitances, $E_{dynamic}$) and the energy required for driving the receiver and buffer circuitry ($E_{receiver}$). The total energy consumption can be approximated by the following equation $$E_{Total} = E_{static} + E_{dynamic} + \qquad (3)$$
$$E_{receiver} = [I_{in}^2 \times (R_{wire} + R_{SHM}) \times T_p] + [CV^2] + E_{receiver}$$

where $T_p$ is the total delay in the line,
$R_{wire}$ and $R_{SHM}$ are the wire and SHM resistances, respectively. The capacitive loss ($\approx CV^2$) is negligible compared to the static ohmic loss which is as expected for a current-sensing architecture driven by a low voltage. Moreover, the reduction in delay with the introduction of buffers leads to the reduction of ohmic/static energy loss, which is proportional to the wire delay (as seen in Eqn. (3)). However, the additional buffer stages themselves add extra energy consumption. As a result, the overall energy consumption first decreases and then starts to increase with additional buffer stages as shown in FIG. 9, which is a graph of energy consumption in fJ/b/mm vs. number of MTJ-based buffers for different Cu-line lengths (i.e., 10 mm, 15 mm, and 20 mm). In Table 3, a comparison of delay and energy consumption between buffered MTJ-based interconnects and full and low swing CMOS interconnects are shown.

TABLE 3

| Performance Comparison with CMOS interconnects | | | |
| --- | --- | --- | --- |
| Cu-Line Length (mm) | Method (with Buffers) | Propagation Delay (ns) | Energy Consumption (fJ/b/mm) |
| 10 | ST Sensors | 0.9975 | 2.5595 |
|  | CMOS (Full) | 0.5264 | 155.4102 |
|  | CMOS (Low) | 1.527 | 74.2801 |

TABLE 3-continued

| Performance Comparison with CMOS interconnects | | | |
| --- | --- | --- | --- |
| Cu-Line Length (mm) | Method (with Buffers) | Propagation Delay (ns) | Energy Consumption (fJ/b/mm) |
| 15 | ST Sensors | 1.4962 | 3.8293 |
|  | CMOS (Full) | 0.7893 | 159.4341 |
|  | CMOS (Low) | 2.663 | 77.2972 |

The comparisons of Table 3 are shown for Cu-line lengths of 10 and 15 mm, respectively. Note that, the energy consumption in the ST sensor is significantly lower in comparison to both full and low swing CMOS interconnects. This reduction of energy consumption is a result of using current-mode signaling with very low voltage swing on the line which suppresses the dynamic/capacitive power (proportional to line voltage squared). Moreover, the static power is also reduced by not using analog amplifiers for signal conversion. However, the delay and area for the approach disclosed herein is somewhat higher than full-swing CMOS technique and hence the application will depend on the chip design requirements.

Figure 10:
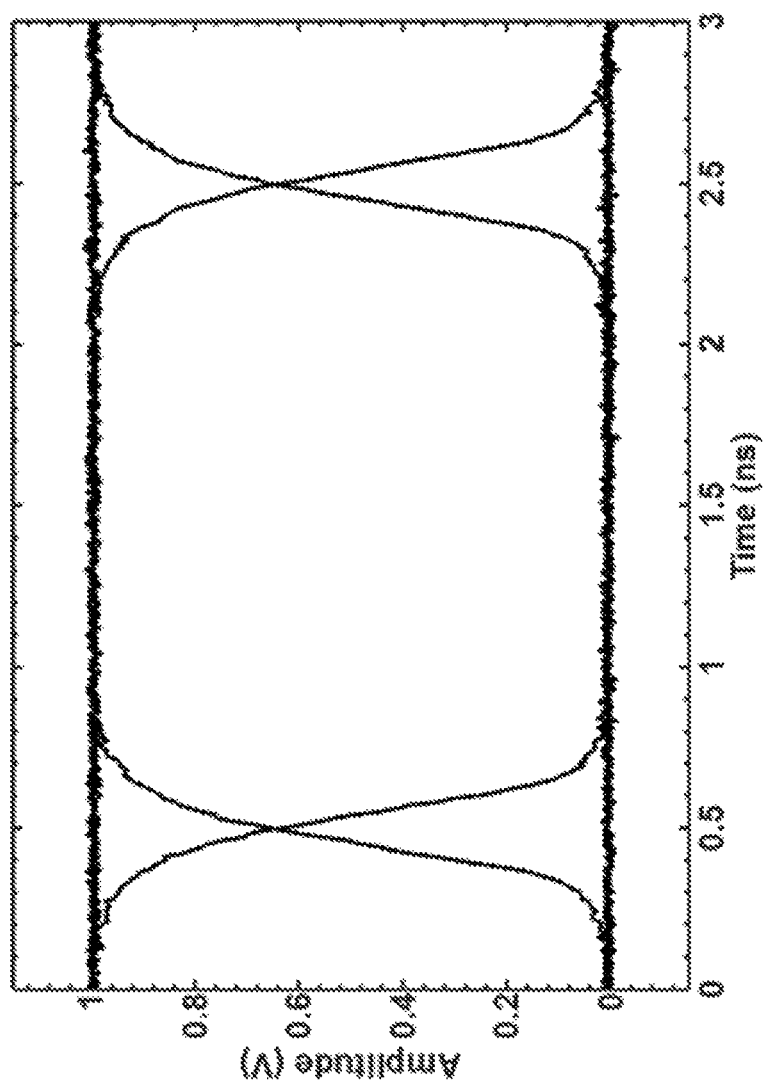
FIG. 10 is a graph of amplitude measured in V vs. time measured in ns showing noise immunity for the bit cell driving mechanism according to the present disclosure.

Since the arrangement disclosed herein is a current-mode technique with a low impedance termination, it inherits the property of higher noise immunity for current-mode architectures. To investigate this added immunity, an eye diagram for the approach according to the present disclosure was obtained to investigate the effect of inter-symbol interference (ISI) and crosstalk noise from neighboring lines. The eye diagram is shown in FIG. 10, which is a plot of amplitude in V vs. time in ns, and which is near optimal for the nominal operating conditions (based on parameters provided in Table 2, and an exemplary clock having a period of 2 ns). However, at faster operating speeds, the DW movement speed saturates and distortions due to ISI can be observed. However, at nominal speeds the approach is fast enough for most of the global lines thereby providing good noise immunity.

Those having ordinary skill in the art will recognize that numerous modifications can be made to the specific implementations described above. The implementations should not be limited to the particular limitations described. Other implementations may be possible.

The invention claimed is:
1. A bit cell driving mechanism, comprising:
a bit cell, including
a first magnetic tunnel junction (MTJ) cell, including
a first magnetic layer with a fixed a polarity (pinned layer (magnetic PL)) in a first magnetic direction,
a non-magnetic layer (NML) vertically disposed adjacent to the magnetic PL,
a second magnetic layer vertically disposed adjacent the NML with selective polarity (free layer (magnetic FL)) having two magnetic regions separated by a laterally moveable domain wall (DW), each of the two magnetic regions having a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold, and a spin-hall metal (SHM) layer vertically disposed adjacent the magnetic FL configured to receive an electrical current therethrough, wherein the electrical current in a first current direction results in the DW to move laterally along the first current direction and wherein the electrical current in the opposite the first current direction results in the DW to move laterally opposite the first current direction;

a second MTJ cell (read MTJ) coupled to the first MTJ cell having a magnetic PL with a fixed magnetic polarity, an NML disposed vertically adjacent the magnetic PL, and a magnetic FL disposed vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold; and an interconnect driver configured to provide electrical current to the SHM layer during a write operation, the first MTJ cell further comprising elevated magnetic PL disposed on opposite sides of the magnetic FL, the elevated magnetic PL limit lateral movement of the DW.

2. The bit cell driving mechanism of claim 1, wherein material of the magnetic PL of the first MTJ is selected from the group consisting essentially of Ru, CoFe, NiMn, CoFeB, and a combination thereof.

3. The bit cell driving mechanism of claim 1, wherein material of the magnetic FL of the first MTJ is selected from the group consisting essentially of CoFe, CoFeB, and a combination thereof.

4. The bit cell driving mechanism of claim 1, wherein material of the SHM layer of the first MTJ is selected from the group consisting essentially of Pt, Ta, and a combination thereof.

5. The bit cell driving mechanism of claim 1, wherein for an SHM layer current density of between $0.5 \times 10^{12}$ A/m$^2$ and $2.0 \times 10^{12}$ A/m$^2$, the DW moves at a velocity of between 140 m/s and 315 m/s.

6. A method for driving a bit cell, comprising:
passing a current through a bit cell, the bit cell comprising:
a first magnetic tunnel junction (MTJ) cell, including
a first magnetic layer with a fixed a polarity (pinned layer (magnetic PL)) in a first magnetic direction,
a non-magnetic layer (NML) vertically disposed adjacent to the magnetic PL,
a second magnetic layer vertically disposed adjacent the NML with selective polarity (free layer (magnetic FL)) having two magnetic regions separated by a laterally moveable domain wall (DW), each of the two magnetic regions having a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold, and a spin-hall metal (SHM) layer vertically disposed adjacent the magnetic FL configured to receive an electrical current therethrough, wherein the electrical current in a first current direction results in the DW to move laterally along the first current direction and wherein the electrical current in the opposite the first current direction results in the DW to move laterally opposite the first current direction;

coupling the bit cell to a second MTJ cell (read MTJ), the read MTJ cell comprising:
having a magnetic PL with a fixed magnetic polarity, an NML disposed vertically adjacent the magnetic PL, and a magnetic FL disposed vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold; and coupling an interconnect driver to the bit cell, to provide the electrical current to the SHM layer during a write operation, the first MTJ cell further comprising elevated magnetic PL disposed on opposite sides of the magnetic FL, the elevated magnetic PL limit lateral movement of the DW.

7. The method of claim 6, wherein material of the magnetic PL of the first MTJ is selected from the group consisting essentially of Ru, CoFe, NiMn, CoFeB, and a combination thereof.

8. The method of claim 6, wherein material of the magnetic FL of the first MTJ is selected from the group consisting essentially of CoFe, CoFeB, and a combination thereof.

9. The method of claim 6, wherein material of the SHM layer of the first MTJ is selected from the group consisting essentially of Pt, Ta, and a combination thereof.

10. The method of claim 6, wherein for an SHM layer current density of between $0.5 \times 10^{12}$ A/m$^2$ and $2.0 \times 10^{12}$ A/m$^2$, the DW moves at a velocity of between 140 m/s and 315 m/s.

11. A bit cell driving mechanism, comprising:
a bit cell, including
a first magnetic tunnel junction (MTJ) cell, including
a first magnetic layer with a fixed a polarity (pinned layer (magnetic PL)) in a first magnetic direction,
a non-magnetic layer (NML) vertically disposed adjacent to the magnetic PL,
a second magnetic layer vertically disposed adjacent the NML with selective polarity (free layer (magnetic FL)) having two magnetic regions separated by a laterally moveable domain wall (DW), each of the two magnetic regions having a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold, and a spin-hall metal (SHM) layer vertically disposed adjacent the magnetic FL configured to receive an electrical current therethrough, wherein the electrical current in a first current direction results in the DW to move laterally along the first current direction and wherein the electrical current in the opposite the first current direction results in the DW to move laterally opposite the first current direction;

a second MTJ cell (read MTJ) coupled to the first MTJ cell having a magnetic PL with a fixed magnetic polarity, an NML disposed vertically adjacent the magnetic PL, and a magnetic FL disposed vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold; and an interconnect driver configured to provide electrical current to the SHM layer during a write operation, wherein during a read operation, a current is passed through the SHM layer, through the bit cell, and through the read MTJ cell, wherein a digital converted voltage at a node between the bit cell and the read MTJ cell represents the magnetic value of the bit cell.

12. The bit cell driving mechanism of claim 11, wherein material of the magnetic PL of the first MTJ is selected from the group consisting essentially of Ru, CoFe, NiMn, CoFeB, and a combination thereof.

13. The bit cell driving mechanism of claim 11, wherein material of the magnetic FL of the first MTJ is selected from the group consisting essentially of CoFe, CoFeB, and a combination thereof.

14. The bit cell driving mechanism of claim 11, wherein material of the SHM layer of the first MTJ is selected from the group consisting essentially of Pt, Ta, and a combination thereof.

15. The bit cell driving mechanism of claim 11, wherein for an SHM layer current density of between $0.5 \times 10^{12}$ A/m$^2$ and $2.0 \times 10^{12}$ A/m$^2$, the DW moves at a velocity of between 140 m/s and 315 m/s.

16. The bit cell driving mechanism of claim 11, further comprising a plurality of i) the bit cells, ii) the read MTJ cells, and iii) the interconnect drivers, each member of the plurality forms a buffer stage coupled to the next buffer stage in a series manner, thereby providing a chain of buffers.

17. The bit cell driving mechanism of claim 16, where a propagation delay of between about 1.1 ns to about 4.0 ns exists for an interconnectivity of between 10 mm and 20 mm of copper when the chain of buffers includes 1 buffer stage.

18. The bit cell driving mechanism of claim 16, where energy consumption of between about 2 fJ/b/mm to about 4.5 fJ/b/mm exists for an interconnectivity of between 10 mm and 20 mm of copper when the chain of buffers includes 1 buffer stage.

19. A method for driving a bit cell, comprising:
passing a current through a bit cell, the bit cell comprising:
a first magnetic tunnel junction (MTJ) cell, including
a first magnetic layer with a fixed a polarity (pinned layer (magnetic PL)) in a first magnetic direction,
a non-magnetic layer (NML) vertically disposed adjacent to the magnetic PL,
a second magnetic layer vertically disposed adjacent the NML with selective polarity (free layer (magnetic FL)) having two magnetic regions separated by a laterally moveable domain wall (DW), each of the two magnetic regions having a magnetic polarity opposite one another such that a dominant magnetic polarity of the magnetic FL is established by lateral position of the DW, and wherein when the dominant magnetic polarity of the magnetic FL's is along the first magnetic direction, the MTJ cell is in a parallel (P) configuration presenting an electrical resistance to current flow below a resistance threshold, and when the dominant magnetic polarity of the magnetic FL's is opposite the magnetic first direction, the MTJ cell is in an anti-parallel (AP) configuration presenting an electrical resistance to current flow higher than the resistance threshold, and
a spin-hall metal (SHM) layer vertically disposed adjacent the magnetic FL configured to receive an electrical current therethrough, wherein the electrical current in a first current direction results in the DW to move laterally along the first current direction and wherein the electrical current in the opposite the first current direction results in the DW to move laterally opposite the first current direction;
coupling the bit cell to a second MTJ cell (read MTJ), the read MTJ cell comprising:
having a magnetic PL with a fixed magnetic polarity, an NML disposed vertically adjacent the magnetic PL, and a magnetic FL disposed vertically adjacent the NML with selective magnetic polarity, wherein when the polarity of the magnetic PL and FL are aligned the read MTJ cell is in the parallel (P) configuration presenting an electrical resistance to current flow lower than the resistance threshold, and wherein when the polarity of the magnetic PL and FL are opposite the read MTJ cell is in the anti-parallel (AP) configuration presenting an electrical resistance to current flow higher than the resistance threshold;
coupling an interconnect driver to the bit cell, to provide the electrical current to the SHM layer during a write operation;
passing a current through the SHM layer, through the bit cell, and through the read MTJ cell during a read operation; and
converting the voltage at a node between the bit cell and the read MTJ cell to a digital value representing the magnetic state of the bit cell.

20. The method of claim 19, wherein material of the magnetic PL of the first MTJ is selected from the group consisting essentially of Ru, CoFe, NiMn, CoFeB, and a combination thereof.

21. The method of claim 19, wherein material of the magnetic FL of the first MTJ is selected from the group consisting essentially of CoFe, CoFeB, and a combination thereof.

22. The method of claim 19, wherein material of the SHM layer of the first MTJ is selected from the group consisting essentially of Pt, Ta, and a combination thereof.

23. The method of claim 19, wherein for an SHM layer current density of between $0.5 \times 10^{12}$ A/m$^2$ and $2.0 \times 10^{12}$ A/m$^2$, the DW moves at a velocity of between 140 m/s and 315 m/s.

24. The method of claim 19, further comprising:
buffering the bit cell by providing a plurality of i) the bit cells, ii) the read MTJ cells, and iii) the interconnect drivers, wherein each member of the plurality forms a buffer stage coupled to the next buffer stage in a series manner, thereby providing a chain of buffers.

25. The method of claim 24, where a propagation delay of between about 1.1 ns to about 4.0 ns exists for an interconnectivity of between 10 mm and 20 mm of copper when the chain of buffers includes 1 buffer stage.

26. The method of claim 24, where energy consumption of between about 2 fJ/b/mm to about 4.5 fJ/b/mm exists for an interconnectivity of between 10 mm and 20 mm of copper when the chain of buffers includes 1 buffer stage.

\* \* \* \* \*